United States Patent
McShane et al.

(10) Patent No.: US 9,093,429 B2
(45) Date of Patent: Jul. 28, 2015

(54) METHODS AND STRUCTURES FOR REDUCING HEAT EXPOSURE OF THERMALLY SENSITIVE SEMICONDUCTOR DEVICES

(75) Inventors: Michael B. McShane, Austin, TX (US); Kevin J. Hess, Austin, TX (US); Perry H. Pelley, Austin, TX (US); Tab A. Stephens, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 181 days.

(21) Appl. No.: 13/535,028

(22) Filed: Jun. 27, 2012

(65) Prior Publication Data

US 2014/0001641 A1 Jan. 2, 2014

(51) Int. Cl.
| | |
|---|---|
| *H01L 23/34* | (2006.01) |
| *H01L 23/52* | (2006.01) |
| *H01L 23/48* | (2006.01) |
| *H01L 23/13* | (2006.01) |
| *H01L 23/36* | (2006.01) |
| *H01L 23/367* | (2006.01) |
| *H01L 23/31* | (2006.01) |
| *H01L 23/00* | (2006.01) |

(52) U.S. Cl.
CPC .............. *H01L 23/481* (2013.01); *H01L 23/13* (2013.01); *H01L 23/36* (2013.01); *H01L 23/3677* (2013.01); *H01L 23/3157* (2013.01); *H01L 24/48* (2013.01); *H01L 2224/293* (2013.01); *H01L 2224/2929* (2013.01); *H01L 2224/32245* (2013.01); *H01L 2224/4824* (2013.01); *H01L 2224/73265* (2013.01); *H01L 2924/15311* (2013.01)

(58) Field of Classification Search
CPC ................................ H01L 23/34; H01L 23/52
USPC ................... 257/680, 706, 724, 774; 438/122
See application file for complete search history.

(56) References Cited

U.S. PATENT DOCUMENTS

| | | | |
|---|---|---|---|
| 5,721,454 A * | 2/1998 | Palmer ......................... | 257/700 |
| 6,190,943 B1 | 2/2001 | Lee et al. | |
| 6,689,638 B2 | 2/2004 | Lin et al. | |
| 7,339,267 B2 | 3/2008 | Thompson et al. | |
| 7,446,407 B2 | 11/2008 | Lin et al. | |
| 7,750,459 B2 | 7/2010 | Dang et al. | |
| 7,759,789 B2 * | 7/2010 | Feng et al. ..................... | 257/712 |
| 7,935,571 B2 | 5/2011 | Ramiah et al. | |
| 8,680,674 B2 | 3/2014 | McShane et al. | |
| 2001/0005051 A1* | 6/2001 | Takeuchi et al. ............... | 257/712 |
| 2004/0070080 A1* | 4/2004 | Pendse ........................... | 257/778 |
| 2006/0131740 A1 | 6/2006 | Kawabata et al. | |

(Continued)

OTHER PUBLICATIONS

Cismaru, C., et al., "Balancing Electrical and Thermal Device Characteristics-Thru Wafer Vias vs. Backside Thermal Vias", CS Mantech Conference, May 16-19, 2011, Palm Springs, California, USA, 4 pgs.
Kofol, J.S., et al., "A Backside Via Process for Thermal Resistance Improvement Demonstrated Using GaAs HBTs", IEEE, GaAs IC Symposium, Sep. 2009, pp. 267-270.
Maheshwary, R., et al., "3D Stacking: EDA Challenges & Opportunities" Sematech Symposium, Tokyo, Japan, Sep. 2009, pp. 1-11.

(Continued)

*Primary Examiner* — Kenneth Parker
*Assistant Examiner* — Christopher Culbert

(57) ABSTRACT

A semiconductor device comprising a substrate, a power bus, a heat source circuit, a heat sensitive circuit, and a plurality of electrically and thermally conductive through-silicon-vias (TSVs) in the substrate. The TSVs are electrically coupled to the power bus and positioned between the heat source circuit and the heat sensitive circuit to absorb heat from the heat source circuit.

17 Claims, 3 Drawing Sheets

(56) References Cited

U.S. PATENT DOCUMENTS

2007/0158787 A1    7/2007  Chanchani
2008/0064138 A1*   3/2008  Barrow .................. 438/106
2009/0302445 A1*  12/2009  Pagaila et al. ............ 257/678
2010/0174858 A1    7/2010  Chen et al.
2010/0213600 A1    8/2010  Lau et al.
2011/0169171 A1    7/2011  Marcoux

OTHER PUBLICATIONS

Clarke, H.A., et al., "Thermal Effect of TSVs in 3D Die-Stacked Integrated Circuits", 2011 14th Euromicro Conference on Digital System Design, IEEE, pp. 503-508, 2011.

Ayala, J.L., et al., "Through Silicon Via-Based Grid for Thermal Control in 3D Chips", Nano-Net. Springer Berlin Heidelberg, 2009, pp. 1-8.

* cited by examiner

METHODS AND STRUCTURES FOR REDUCING HEAT EXPOSURE OF THERMALLY SENSITIVE SEMICONDUCTOR DEVICES

BACKGROUND

1. Field

This disclosure relates generally to semiconductor devices, and more specifically, to reducing heat exposure of thermally sensitive semiconductor devices.

2. Related Art

Thermally sensitive semiconductor components may be sensitive to heat transferred from neighboring components on a die even if the devices do not generate much heat themselves. For example, transistors in a Double Data Rate type 3 (DDR3) Random Access Memory (RAM) memory die may be sensitive to heat from neighboring sense amps, write, and pre-charge circuits. As the temperature of the transistors increases, the transistors leak current and the refresh rate of the transistors must be increased to prevent the transistors from losing the data being stored. Increased refresh rates use more power than lower refresh rates. As semiconductor die are designed with ever increasing functionality and speed requirements, it is desirable to find ways to reduce power consumption as well as reduce/remove heat generated by the die.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Embodiments of methods and semiconductor devices disclosed herein provide a cost effective solution using thermally conductive through-silicon vias (TSVs) that are placed between heat source circuits and heat sensitive circuits or elements on a circuit substrate to protect the heat sensitive circuits from circuits that generate heat.

Figure 1:
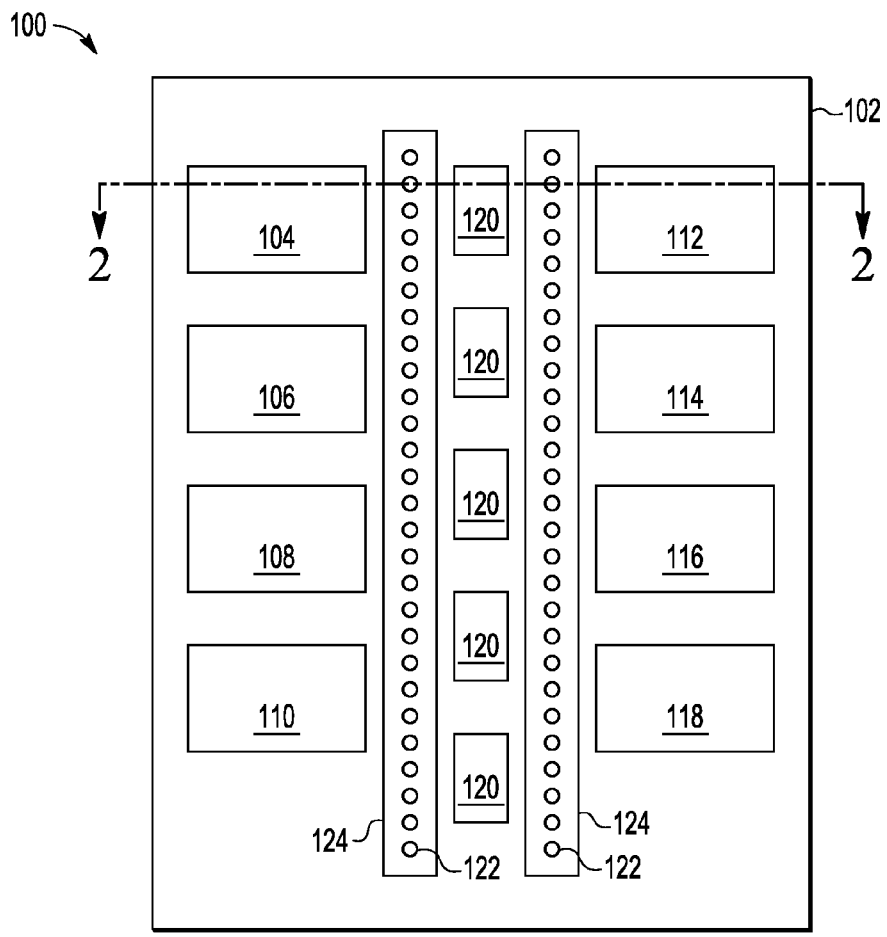
FIG. 1 shows a top view of an embodiment of a semiconductor die in accordance with the present invention.

FIG. 1 shows a top view of an embodiment of a front side of semiconductor die 100 in accordance with the present invention that can include a circuit substrate 102 with one or more heat source circuits 120, one or more heat sensitive circuits 104-118, and thermally and electrically conductive TSVs 122 placed between the heat source circuit(s) 120 and the heat sensitive circuit(s) 104-118. TSVs 122 are further coupled to a power bus 124. The TSVs 122 help prevent at least some of the heat from the heat source circuit(s) 120 from affecting the heat sensitive circuit(s) 104-118. Semiconductor die 100 can include one or more power buses 124, with each TSV 122 being in electrical and physical contact with a respective power bus 124. Heat collected from the heat source circuit(s) 120 by either the TSVs 122 or the power bus 124 can then be conducted through the TSVs 122 and away from the heat sensitive circuit(s) 104-118.

As an example of a use for TSVs 122, semiconductor die 100 can be a memory die that is used to store data in a computer processing system (not shown). In some embodiments, the memory die is a Double Data Rate type 3 (DDR3) Random Access Memory (RAM), however, other suitable types of memory die can be used. In a DDR3 RAM memory device, heat sensitive devices 104-118 can be any type of dynamic random access memory (DRAM) bit cells that are used to store data in a computer processing system. The DDR3 memory device can also include heat source circuits 120 such as sense amps, write circuits, pre-charge circuits, I/O circuits and/or other circuits that generate heat. In a Double Data Rate type 3 (DDR3) Random Access Memory (RAM), some heat source circuits 120 can be positioned along a center spine of die 100. The heat sensitive circuits 104-118 can be bit cell arrays implemented on one or both sides or the center spine on the memory die. As the bit cells are exposed to increased temperature generated by heat source circuits 120, they begin to leak current and over time lose data. The data can be refreshed at higher frequency to restore the charge, but the refresh operation consumes power in situations where it is more desirable to reduce power consumption. In some implementations, heat source circuits 120 such as sense amplifier circuits can be embedded within the arrays of bit cells, which are heat sensitive circuits 104-118 and can be at least partially thermally isolated by thermally conductive TSV's 122 placed between the heat source circuits 120 and the heat sensitive circuits 104-118. TSVs 122 can be formed on a wafer before the wafer is singulated into individual semiconductor die 100.

TSVs 122 can be formed in a row or other suitable arrangement between the heat source circuit(s) 120 and the heat sensitive circuit(s) 104-118. TSVs 122 are electrically coupled to power bus 124 and extend from power bus 124 to the back side of circuit substrate 102. Power bus 124 may be electrically coupled to a power source or ground. In one embodiment the power bus is fabricated in the first metal above the top surface of substrate 102. TSVs 122 are not connected to any active circuitry except power bus 124. The term "active circuitry" refers to components that are capable of conducting electron flow. TSVs 122 can be filled with any thermally conductive material or combination of materials such as copper, tungsten, gold, aluminum, silver, or carbon nanotubes. Other suitable materials can be used.

Figure 2:
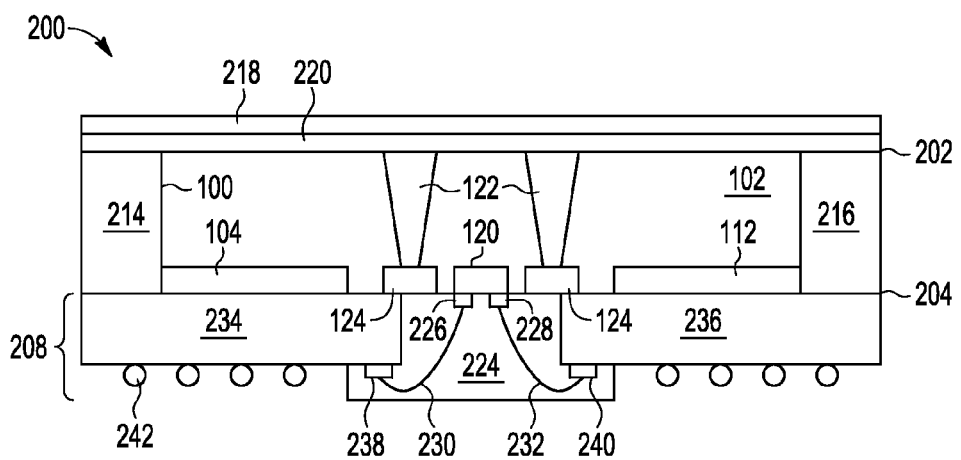
FIG. 2 shows a cross sectional side view of an embodiment of a packaged semiconductor device that includes the semiconductor die of FIG. 1.

FIG. 2 shows a cross sectional side view A-A of an embodiment of a packaged semiconductor device 200 that includes the semiconductor die 100 of FIG. 1 with TSVs 122 formed in circuit substrate 102. TSVs 122 extend from a back side 202 of semiconductor die 100 to power buses 124 at a top side 204 of semiconductor die 100. One or more TSVs 122 are located between heat source circuit 120 and heat sensitive circuits 104, 112. Heat source circuits 120 and heat sensitive circuits 104, 112 are located at the top side 204 of semiconductor die 100. Heat sensitive circuit 104 is positioned on one side of one of thermally conductive TSVs 122, while heat source circuit 120 is positioned between first and second TSVs 122. Another heat sensitive circuit 112 is positioned on the other side of the second TSV 122. Other combinations and layouts for heat source circuits 120, heat sensitive circuits 112, and TSVs 122 can be used. TSV's 122 can be electrically isolated from substrate 102. Substrate 102 can be biased to the same potential as power bus 124. Further, substrate 102 can be but does not have to be electrically isolated.

Encapsulant sections 214, 216 can be positioned around the periphery of semiconductor die 100. Heat source circuit 120 includes one or more circuits that generate heat such as a sense amp circuit, a memory cell write circuit, a memory cell pre-charge circuit, I/O circuit or other heat-generating device.

Packaged semiconductor device 200 can include a thermally conductive heat spreader 218 attached to the back side 202 of semiconductor die 100 using a layer of thermally conductive adhesive 220 or other suitable fastening mechanism. Heat spreader 218 helps dissipate heat conducted away from heat source circuits 120 by TSVs 122. Heat spreader 218 can be formed of any suitable thermally conductive material or combination of materials such as copper, tungsten, gold, aluminum, silver, or carbon nanotubes. In other embodiments, heat spreader 218 may be formed of thermally conductive, electrically insulating materials, such as boron nitride, aluminum nitride, and/or combinations thereof. Other suitable materials can be used. In another embodiment heat spreader 218 is electrically coupled to the TSVs 122 such that an electrically conducting heat spreader is biased to the potential of the TSVs 122, for instance ground.

Device 200 can include die 100 attached or mounted on a suitable package substrate such as the window ball grid array (BGA) substrate 208 shown in FIG. 2. Window BGA substrate 208 can include substrate sections 234, 236 and encapsulant 224 in an opening in the central portion of the substrate 208 that is referred to as a window. Wire bonds 230 and 232 can be formed through the window to connect electrically conductive contacts or pads 226, 228 on heat source circuitry 120 to conductive contacts 238, 240 on respective substrate sections 234, 236. Encapsulant 224 fills the window to protect wire bonds 230, 232. An array of electrically conductive bumps 242 are formed on the bottom of BGA substrate 208 and can be used to attach semiconductor device 200 to another substrate such as a printed circuit board. Electrically conductive bumps 242 can be electrically coupled to conductive contacts 238 and 240.

Semiconductor die 100 can include one or more metal layers (not shown), and one or more insulating layers (not shown) between the metal layers that form electronic circuitry such as transistors, sense amps, pre-charge circuits, write circuits, and I/O circuits. The top of the thermally conductive TSVs 122 can be exposed on the back side 202 of the die 100 so that TSVs 122 can conduct heat to heat spreader 218

Thermally conductive TSVs 122 can be filled with copper, tungsten, gold, aluminum, silver, carbon nanotubes or other thermally conductive material. In other embodiments, TSVs 122 may be formed of thermally conductive, electrically insulating materials, such as boron nitride, aluminum nitride, and/or combinations thereof. Other suitable materials can be used.

TSVs 122 in combination with power bus 124 help prevent heat source circuitry 120 from affecting the operation of heat sensitive circuitry 104, 112.

Figure 3:
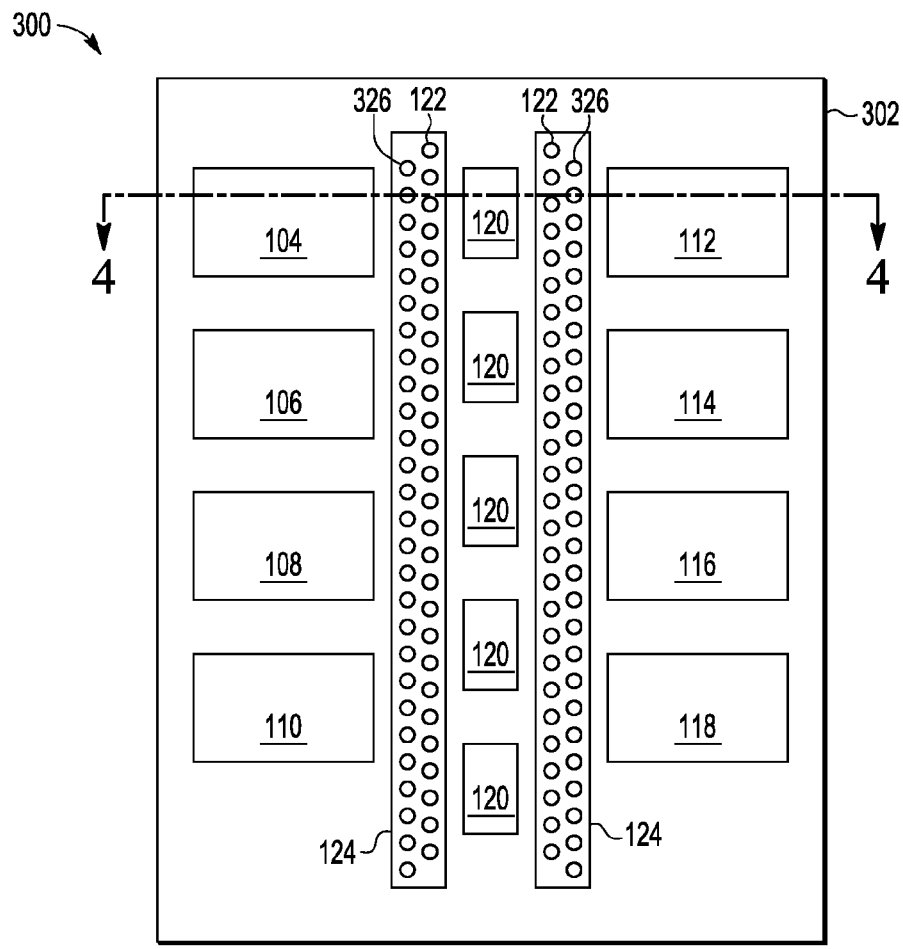
FIG. 3 shows a top view of another embodiment of a semiconductor die in accordance with the present invention.

FIG. 3 shows a top view of another embodiment of a semiconductor die 300 in accordance with the present invention in which thermally insulating TSVs 326 can be placed between the thermally conductive TSVs 122 and the heat sensitive circuit(s) 104-118, and/or between thermally conductive TSVs 122 and heat source circuit(s) 120. In other implementations, thermally insulating TSVs 326 can be used instead of thermally conducting TSVs 122. As shown in FIG. 3, thermally insulating TSVs 326 can be formed in a row that is staggered with respect to the row of TSVs 122. The staggered alignment can help maintain the structural integrity of the substrate 302 in which TSVs 122, 326 are formed. While TSV's 122 are electrically coupled to power bus 124 and therefor under power bus 124, thermally insulating TSVs are not required to be under power bus 124. Thermally insulating vias may come in proximity of power bus 124, but are not necessarily electrically coupled to power bus 124. Other suitable arrangements of TSVs 122, 326 can be used.

Thermally insulating TSVs 326 can be filled with any suitable thermally insulating material or combination of materials. Examples of insulating materials are silicon dioxide, silicon nitride, silica aerogels, or combinations thereof. Other suitable thermally insulating materials can be used.

TSVs 122, 326 can be formed by etching or using a laser to form openings through layers of circuit substrate 302, and filling the openings with a respective thermally conductive or insulating material. TSVs 122 can be formed from approximately one micron to approximately 10 microns from heat source circuits 120.

Figure 4:
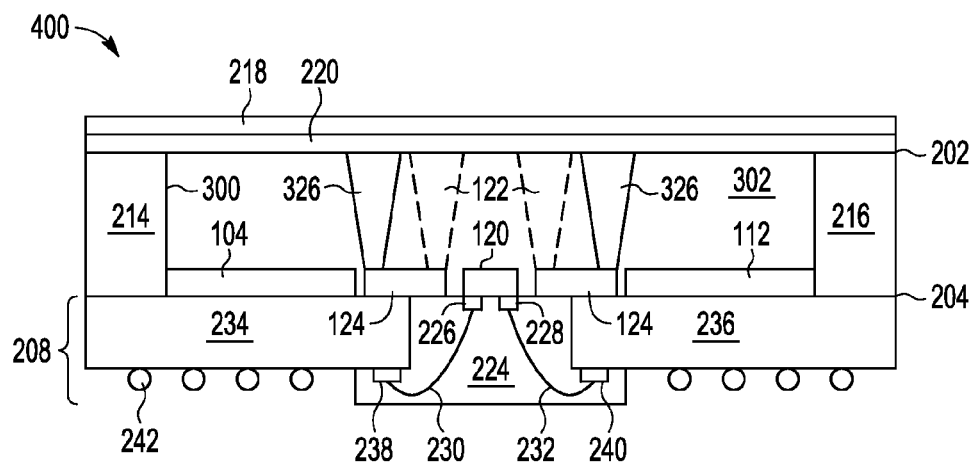
FIG. 4 shows a cross sectional side view of another embodiment of a packaged semiconductor device that includes the semiconductor die of FIG. 3.

FIG. 4 shows a cross sectional side view of an embodiment of a packaged semiconductor device 400 that includes the semiconductor die 300 of FIG. 3 with thermally insulating TSVs 326 and thermally conductive TSVs 122 formed in circuit substrate 302. TSVs 122, 326 can extend between power buses 124 and the top side 202 of die 300 through circuit substrate 302. TSVs 326 can be but are not required to be positioned under power bus 124. Insulating TSVs 326 can be positioned between conductive TSVs 122 and the heat sensitive circuits 104, or other suitable location, 112 and are not electrically coupled to any active circuitry or to power buses 124.

Thermally insulating TSVs 326 can be filled with suitable thermally insulating material or combination of materials. Examples of insulating materials are silicon dioxide, silicon nitride, silica aerogels, or combinations thereof. Other suitable thermally conductive materials can be used.

Figure 5:
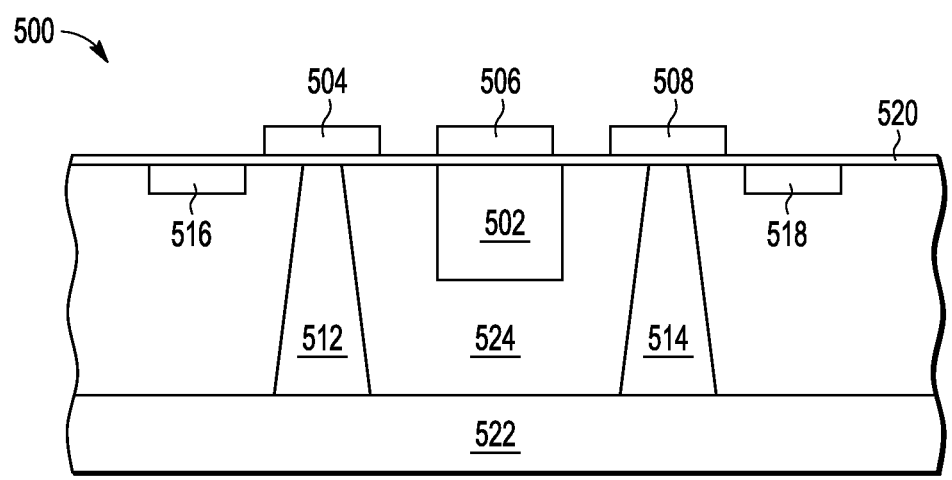
FIG. 5 shows a cross sectional side view of another embodiment of a packaged semiconductor device.

FIG. 5 shows a cross sectional side view of another embodiment of a packaged semiconductor device 500 at an intermediate stage of back end of line (BEOL) processing during which first metal layer 520, bond pad 506, and power buses 504, 508 are deposited on wafer 510. Thermally conductive through-silicon vias (TSVs) 512, 514 are formed in circuit substrate 524 and coupled between heat spreader 522 and respective power buses 504, 508. Heat source circuitry 502 is coupled to bond pad 506 and positioned between TSVs 512, 514. Heat sensitive circuitry 516, 518 is coupled to metal layer 520 and positioned on an opposite side of respective TSVs 512, 514 relative to heat source circuitry 502. TSVs 512, 514 conduct heat from heat source circuitry 502 to heat spreader 522, metal layer 520, and power buses 504, 508. In some embodiments, power buses 504 and 508 are fabricated on metal layer 520.

Thermally conductive TSVs 512, 514 can be filled with copper, tungsten, gold, aluminum, silver, carbon nanotubes, and/or other thermally conductive material. In other embodiments, TSVs 512, 514 may be formed of thermally conductive, electrically insulating materials, such as boron nitride, aluminum nitride, and/or combinations thereof. Other suitable materials can be used.

Note that in addition to thermally conductive TSVs 512, 514, thermally insulating TSVs (such as TSVs 326 shown in FIGS. 3 and 4) can be included in semiconductor device 500.

As used herein, the term "between" refers to being in a space between two or more objects, such as heat source circuit(s) 120, 502 and heat sensitive circuits 104-118, 516, 518. The space may be vertically and/or horizontally oriented, but it is not necessary for TSVs 122, 326, 512, 514 to be vertically or horizontally aligned with heat source circuit(s) 120, 502 and heat sensitive circuits 104-118, 516, 518.

By now it should be appreciated that although a DDR3RAM has been used as an example herein, it is anticipated that TSVs 122 and/or TSVs 326 can be used in any semiconductor device where it is desirable to prevent heat generated by heat source circuits 120 from affecting operation of heat sensitive circuits 104-118.

In one embodiment, a semiconductor device 100, 300, 500 can comprise a substrate 102, 302, a power bus 124, a heat source circuit 120, a heat sensitive circuit 104, 112, and a plurality of electrically and thermally conductive through-silicon-vias TSVs 122 in the substrate 102, 302. The conductive TSVs 122 are electrically coupled to the power bus 124, and the conductive TSVs 122 are positioned between the heat source circuit 120 and the heat sensitive circuit 104, 112.

In another aspect, the semiconductor device can further comprise a plurality of thermally insulating TSVs 326 placed between the heat source circuit 120 and the heat sensitive circuit 104, 112.

In another aspect, the semiconductor device can further comprise a heat sink 218 coupled to the plurality of conductive TSVs 122.

In another aspect, the semiconductor device can further comprise at least one of the group consisting of: the conductive TSVs 122 are formed with one from a group of materials consisting of: copper, tungsten, gold, aluminum, silver, boron nitride, aluminum nitride, and carbon nanotubes; the conductive TSVs 122 are staggered with respect to the insulating TSVs 326; and the insulating TSVs 326 are positioned between the conductive TSVs 122 and the heat sensitive circuit 104, 112.

In another aspect, the insulating TSVs 326 can be formed with one of a group of materials consisting of: a silicon dioxide, an aerogel, and a silicon nitride.

In another aspect, the semiconductor device can further comprise a package substrate 208. The heat source circuit 120, the heat sensitive circuit 104, 112, the power bus 124, and the conductive TSVs 122 can be included in a circuit module and a top side of the circuit module can be coupled to the package substrate 208.

In another aspect, the heat sensitive circuit 104, 112 can be a memory cell, the power bus 124 can be a power supply bus 124, and the heat source circuit 120 can be at least one of the group consisting of: a sense amp circuit, a memory cell write circuit, and a memory cell pre-charge circuit.

In another aspect, the conductive TSVs 122 are electrically isolated from the substrate 102, 302.

In another embodiment, a semiconductor device 100, 300, 500 comprises a circuit substrate 102, 302 including a power bus 124, a heat source circuit 120, a heat sensitive circuit 104, 112, and a plurality of thermally conductive through silicon vias TSVs connected to the power bus 124. The conductive TSVs 122 are positioned between the heat source circuit 120 and the heat sensitive circuit 104, 112. A package substrate 208 can be coupled to the circuit substrate 102, 302.

In another aspect, a top of the thermally conductive TSVs 122 can be formed through a back side of the circuit substrate 102, 302. The semiconductor device 100, 300, 500 can further comprise a heat spreader coupled to the thermally conductive TSVs 122.

In another aspect, the semiconductor device can further comprise a plurality of thermally insulating TSVs 326 formed in the circuit substrate 102, 302, wherein the insulating TSVs 326 are positioned between the conductive TSVs 122 and the heat sensitive circuit 104, 112.

In another aspect, the semiconductor device can further comprise a plurality of thermally insulating TSVs 326 formed in the circuit substrate 102, 302, wherein the thermally conductive TSVs 122 are formed in a row and the row is staggered with respect to a row of the thermally insulating TSVs 326.

In another aspect, the thermally insulating TSVs 326 are formed with one of a group of materials consisting of: a silicon dioxide and a silicon nitride.

In another aspect, the package substrate 208 can be a window ball grid array BGA substrate 102, 302 and the circuit substrate 102, 302 can be coupled to the window BGA substrate 102, 302 with wirebonds 230, 232.

In another aspect, the heat sensitive circuit 104, 112 is a memory cell and the heat source circuit 120 is at least one of the group consisting of: a sense amp circuit, a memory cell write circuit, and a memory cell pre-charge circuit.

In another aspect, the thermally conductive TSVs 122 are formed with one from a group of materials consisting of: copper, tungsten, gold, aluminum, silver, boron nitride, aluminum nitride, and carbon nanotubes.

In another aspect, the heat sensitive circuit 104, 112 includes a transistor.

In another embodiment, a method can comprise forming a plurality of thermal vias 122, 326 in a back side 202 of the circuit substrate 102, 302, and electrically coupling a top side of a circuit substrate 102, 302 to a package substrate 208. The thermal vias 122, 326 do not extend to the top side of the circuit substrate 102, 302 and can be connected to a power bus 124 in the circuit substrate 102, 302. The thermal vias 122, 326 can be placed between heat source circuitry 120 and heat sensitive circuitry 104, 112.

In another aspect, the thermal vias are at least one of the group consisting of: thermally conductive vias 122 and thermally insulating vias 326.

In another aspect, the method can further comprise attaching a heat sink 218 to the back side 202 of the circuit substrate 102, 302.

The term "coupled," as used herein, is not intended to be limited to a direct coupling or a mechanical coupling.

Because the apparatus implementing the present disclosure is, for the most part, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

Although the disclosure is described herein with reference to specific embodiments, various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A semiconductor device, comprising:
   a substrate;
   a power bus;
   a heat source circuit;
   a heat sensitive circuit;
   a plurality of electrically and thermally conductive through-silicon-vias (TSVs) in the substrate, wherein the conductive TSVs are electrically coupled to the power bus, and the conductive TSVs are positioned between the heat source circuit and the heat sensitive circuit.

2. The semiconductor device of claim 1, further comprising:
   a plurality of thermally insulating TSVs placed between the heat source circuit and the heat sensitive circuit.

3. The semiconductor device of claim 1, further comprising:
   a heat sink coupled to the plurality of conductive TSVs.

4. The semiconductor device of claim 2, wherein at least one of the group consisting of:
   the conductive TSVs are formed with one from a group of materials consisting of:
      copper, tungsten, gold, aluminum, silver, boron nitride, aluminum nitride, and carbon nanotubes;
   the conductive TSVs are staggered with respect to the insulating TSVs; and
   the insulating TSVs are positioned between the conductive TSVs and the heat sensitive circuit.

5. The semiconductor device of claim 2, wherein the insulating TSVs are formed with one of a group of materials consisting of: a silicon dioxide, an aerogel, and a silicon nitride.

6. The semiconductor device of claim 1, further comprising:
   a package substrate, wherein the heat source circuit, the heat sensitive circuit, the power bus, and the conductive TSVs are included in a semiconductor die and a top side of the semiconductor die is coupled to the package substrate.

7. The semiconductor device of claim 1, wherein the heat sensitive circuit is a memory cell, the power bus is a power supply bus, and the heat source circuit is at least one of the group consisting of: a sense amp circuit, a memory cell write circuit, and a memory cell pre-charge circuit.

8. The semiconductor device of claim 1, wherein the conductive TSVs are electrically isolated from the substrate.

9. A semiconductor device, comprising:
   a circuit substrate including:
      a power bus;
      a heat source circuit;
      a heat sensitive circuit;
      a plurality of thermally conductive through silicon vias (TSVs) connected to the power bus, wherein the conductive TSVs are positioned between the heat source circuit and the heat sensitive circuit; and
   a package substrate coupled to the circuit substrate.

10. The semiconductor device of claim 9, wherein a top of the thermally conductive TSVs are formed through a back side of the circuit substrate, the semiconductor device further comprising:
    a heat spreader coupled to the thermally conductive TSVs.

11. The semiconductor device of claim 9, further comprising:
    a plurality of thermally insulating TSVs formed in the circuit substrate, wherein the insulating TSVs are positioned between the conductive TSVs and the heat sensitive circuit.

12. The semiconductor device of claim 9, further comprising: a plurality of thermally insulating TSVs formed in the circuit substrate, wherein the thermally conductive TSVs are formed in a row and the row is staggered with respect to a row of the thermally insulating TSVs.

13. The semiconductor device of claim 11, wherein the thermally insulating TSVs are formed with one of a group of materials consisting of: a silicon dioxide, an aerogel, and a silicon nitride.

14. The semiconductor device of claim 9, further comprising:
    the package substrate is a window ball grid array (BGA) substrate and the circuit substrate is coupled to the window BGA substrate with wirebonds.

15. The semiconductor device of claim 9, wherein the heat sensitive circuit is a memory cell and the heat source circuit is at least one of the group consisting of: a sense amp circuit, a memory cell write circuit, and a memory cell pre-charge circuit.

16. The semiconductor device of claim 11, wherein the thermally conductive TSVs are formed with one from a group of materials consisting of: copper, tungsten, gold, aluminum, silver, boron nitride, aluminum nitride, and carbon nanotubes.

17. The semiconductor device of claim 9, wherein the heat sensitive circuit includes a transistor.

* * * * *